United States Patent [19]
Sung et al.

[11] Patent Number: 5,817,176
[45] Date of Patent: Oct. 6, 1998

[54] APPARATUS FOR PREPARING A SINGLE CRYSTAL OF SILICON

[75] Inventors: Hyung-Jin Sung, Taejon; Jung-Il Choi, Taegu, both of Rep. of Korea

[73] Assignee: Korea Advanced Institute of Science and Technology, Taejon, Rep. of Korea

[21] Appl. No.: 634,017

[22] Filed: Apr. 17, 1996

[30] Foreign Application Priority Data

Apr. 17, 1995 [KR] Rep. of Korea ............... 1995-8960

[51] Int. Cl.$^6$ .................................... C30B 35/00
[52] U.S. Cl. .............................. 117/201; 117/15; 117/28; 117/30; 117/202; 117/900
[58] Field of Search .................... 117/14, 15, 28, 117/30, 201, 202, 900, 917

[56] References Cited

U.S. PATENT DOCUMENTS

| | | | |
|---|---|---|---|
| 4,565,671 | 1/1986 | Matsutani et al. | 117/917 |
| 4,592,895 | 6/1986 | Matsutani et al. | 117/917 |
| 4,622,211 | 11/1986 | Suzuki et al. | 117/917 |

FOREIGN PATENT DOCUMENTS

| | | | |
|---|---|---|---|
| 0033297A | 2/1985 | Japan | 117/917 |
| 360051690A | 3/1985 | Japan | 117/917 |

OTHER PUBLICATIONS

W.E. Langlois, Buoyancy–Driven Flows in Crystal–Growth Melts, Ann. Rev. Fluid Mech, 17:191–215 (1985).

Hyung–Jin Sung et al., Prediction of Transient Oscillating Flow in Czochralski Convection, Int. J. Heat Mass Transfer, 38(9):1627–1636 (1995).

H.J. Scheel et al., Crystal Pulling Using Acrt, Journal of Crystal Growth, 49:291–296 (1980).

M. Mihelcic et al., Numerical Simulation of Forced Convection in the Classical Czochralski Method, in Acrt and Cacrt, Journal of Crystal Growth, 53:337–354 (1981).

I.H. Brunskill et al., High–Temperature Solution Growth of $Pb(Fe_{0.5}Nb_{0.5})O_3$ and $Pb(Mn_{0.5}Nb_{0.5})O_3$ Crystals, Journal of Crystal Growth, 56:541–546 (1982).

M. Mihelcic et al., Numerical Simulation of Free and Forced Convection in the Classical Czochralski Method and in Cacrt, Journal of Crystal Growth, 57:300–317 (1982).

D. Rytz et al., Crystal Growth of $KTa_{1-x}Nb_xO_3$ ($0<X\leq0.04$) Solid Solutions by a Slow–Cooling Method, Journal of Crystal Growth 59:468–484 (1982).

A. Horowitz et al., Bridgman Growth of $Rb_2MnCl_4$ via Accelerated Crucible Rotation Technique, Journal of Crystal Growth, 61:323–328 (1983).

H.J. Scheel et al., Crystal Growth and Characterization of "Striation–Free" $KTa_{1-x}Nb_xO_3$ ($X\cong0.26$) Solid Solutions, Journal of Crystal Growth, 62:291–298 (1983).

E. Kuroda et al., The Effect of Temperature Oscillations at the Growth Interface on Crystal Perfection, Journal of Crystal Growth, 68:613–623 (1984).

(List continued on next page.)

*Primary Examiner*—Felisa Garrett
*Attorney, Agent, or Firm*—Jacobson, Price, Holman & Stern, PLLC

[57] ABSTRACT

The present invention relates to an apparatus for preparing a single crystal of silicon by which a high-quality single crystal of silicon can be prepared by changing the rotation rate of a crucible or a seed and a process for preparing a single crystal of silicon thereby. As compared with a conventional apparatus employing Czochralski method, which comprises a rotating axis of seed, a seed, a crucible, a heater, a rotary axis of crucible, a chamber and an adiabatic layer, the apparatus of the present invention is characterized by the improvement comprising means for controlling the rotation rate of the crucible or the seed, each of which consists of a D.C. voltage, a function generator, a voltage summing circuit and a stepping motor.

4 Claims, 5 Drawing Sheets

OTHER PUBLICATIONS

T. Munakata et al., Onset of Oscillatory Flow in a Czochralski Growth Melt and Its Suppression by Magnetic Field, Journal of Crystal Growth, 106:566–576 (1990).

H. Ozoe et al., Transition Mechanism of Flow Modes in Czochralski Convection, Journal of Crystal Growth, 110:472–480 (1991).

R.W. Series et al., The Use of Magnetic Fields in Semiconductor Crystal Growth, Journal of Crystal Growth, 113:305–328 (1991).

Yi–Bin Xu et al., Accelerated Crucible Rotation Technique: Bridgman Growth of $Li_2B_4O_7$ Single Crystal and Simulation of the Flows in the Crucible, Journal of Crystal Growth, 133:95–100 (1993).

APPARATUS FOR PREPARING A SINGLE CRYSTAL OF SILICON

FIELD OF THE INVENTION

The present invention relates to an apparatus for preparing a single crystal of silicon, more specifically, to an apparatus for preparing a single crystal of silicon by which a high-quality single crystal of silicon can be prepared by changing the rotation rate of a crucible or a seed and a process for preparing a single crystal of silicon thereby.

BACKGROUND OF THE INVENTION

For the growth of a single crystal of silicon (hereinafter referred to as "SCS"), apparatus employing Czochralski method have been conventionally used in the art. Typically, a cylindrical ingot of single crystal is grown from a seed crystal which is held at the tip of the rotating pull-rod. The growth of a single crystal basically involves the process of solidification by cooling of the crystal ingot (see: J. C. Brice, Crystal Growth Processes, John Wiley and Sons, pp. 129–154 (1986)).

In accordance with the Czochralski method, a step of mixing the molten silicon with dopants such as B, Sb and P to form P- or N-type semiconductor is essentially employed in the growth of SCS. However, the dopants are not easily doped on the SCS in a uniformity and they are concentrated in the lower part of the single crystal, which has become detrimental factors to produce a high-quality of SCS. Moreover, impurities such as oxygen and carbon, except for the dopants, are contaminated with the SCS, which results in a change of the yield and characteristics of the semiconductor.

To solve said problems in the SCS preparation, an improved approach has been reported that a SCS can be produced by a continuous or intermittent supply of silicon, while pulling out the SCS (see: Japanese Patent Laid-open Nos. (sho) 56-84397 and 164097). However, said method has revealed some drawbacks that solid silicon is obtained as a by-product when granular or massive silicon material is supplied to a crucible containing the molten silicon, finally to give low-quality of SCS, due to the solidification in another part except for crystal/melt interface.

Under the circumstances, Korean Patent Publication No. 93-3044 suggests a method of preparing a SCS in which dopants and oxygen can be distributed uniformly, by protecting solidification of the molten silicon except in the surface of a single crystal growth. Said method, however, has a demerit that oxygen concentration in the SCS is much higher than that of the conventional Czochralski method. Accordingly, there has been continued a need to develop a method by which oxygen concentration of the SCS is lowered to the level of Czochralski method, since oxygen concentration in the SCS is a critical factor to determine the quality of an integrated circuit employing the SCS.

In this connection, Korean Patent Publication No. 93-5407 teaches a method of manufacturing a SCS whose oxygen concentration can be lowered to a level of conventional Czochralski method. However, the method by which a high-quality of SCS can be obtained by controlling the concentrations of dopants and oxygen in the growth of SCS, has produced a SCS with striation which is caused by the temperature oscillation in the molten silicon, due to the oscillatory fluid flow which is frequently appeared in Czochralski method. On the other hand, it has been known that: the fluid flow is caused by buoyancy and thermo-capillary phenomenon in molten silicon, rotation of the crystal and crucible, and Lorentz force by magnetic field; and, it produces striation to injure the quality of the SCS.

Accordingly, studies on the development of an improved apparatus for preparing a high-quality of SCS to get rid of the striation, have been actively carried out as described below.

For example, an apparatus employing a magnetic field part has been reported to attenuate the temperature oscillation, lower oxygen concentration and remove the striation caused by the fluid flow in molten silicon (see: R. W. Series et al., J. Crystal Growth, 113:305–328 (1991); T. Munakata et al., J. Crystal Growth, 106:566–576 (1990)).

The prior art apparatus which employs magnetic field to control the fluid flow of molten silicon, based on the conductive property of the molten silicon, is schematically depicted in FIG. 1.

Referring to FIG. 1, the prior art apparatus for SCS preparation comprises: a chamber(11) in which a crucible(4) is positioned; a heater(5) which is surrounded by an adiabatic layer(12), is installed at the outer side of the crucible to guide the heat generated from the heater to the crucible (4), finally to give a molten silicon. On the other hand, a monitoring mirror(13) is positioned on the chamber(11) to detect the temperature change; and, a rotating axis of seed(1) and a seed(2) are also equipped to pull out the seed(2) while rotating, which causes to grow solid-type SCS(3) in the lower part of the seed(2). The magnetic field generated in the crucible(4) by the electric current applied from an electrode (6), controls temperature oscillation of the dielectric molten silicon to lower the striation and, the crucible is counter-rotated by a rotating axis of crucible(9) to lower the temperature oscillation.

The said apparatus which controls the temperature oscillation by a magnetic field, lowers the temperature and concentration oscillation in the crucible and gives a high-quality of SCS, by employing Czochralski method in which a molten silicon is added in the crystalline growth, while blocking the influx of oxygen from the outside to the crucible (i.e., to a boundary in which crystal is grown) by installing a septum in the crucible.

Nevertheless, the prior art apparatus has not been practically applied in the art, since they have also revealed some drawbacks: they essentially require a magnetic field generation part which is very expensive and needs high electric power to maintain and operate; the size of the crucible is naturally enlarged; and, lots of magnetic field is essentially required to prepare a large-size single crystal over 12 inch employed in the semiconductor industry.

SUMMARY OF THE INVENTION

A primary object of the present invention is, therefore, to provide an apparatus for preparing a single crystal of silicon which can lower the striation without complicated auxiliary equipments or extra energy consumption, which can also be applied to manufacture a large-sized wafer.

The other object of the invention is to provide a process for preparing a high-quality single crystal of silicon by the apparatus in a simple and economical manner.

DETAILED DESCRIPTION OF THE INVENTION

Compared with a conventional apparatus employing the Czochralski method, which comprises a rotating axis of seed, a seed, a crucible, a heater, a rotary axis of crucible, a chamber and an adiabatic layer, an apparatus for preparing a SCS of the present invention is characterized by the improvement comprising means for controlling the rotation rate of the crucible or the seed, each of which consists of a D.C. voltage, a function generator, a voltage summing circuit and a stepping motor. At this time, the means for controlling the rotation rate of the crucible is constructed to change the rotation rate of the crucible to be dependent on time, in accordance with a general formula (I).

$$\Omega = \Omega_0(1 + A\sin 2\pi ft) \tag{I}$$

wherein:

$\Omega$ represent the rotation rate of a crucible or a seed by a stepping motor;

$\Omega_0$ represents the rotation rate of a crucible or a seed of a conventional apparatus for SCS preparation;

A represents an amplification factor of rotation rate;

f represents a frequency factor of rotation rate with respect to natural frequent; and t represents nondimensional time.

Moreover, the apparatus for preparing a SCS may further comprise an electrode for the formation of magnetic field in the crucible.

A process for preparing a SCS of the present invention comprises the steps of:

(i) heating molten silicon contained in a crucible by a heater which is positioned in the outer side of the crucible; and, (ii) pulling out a seed with the rotation of the crucible or the seed while changing the rotation rate of the crucible or the seed to be dependent on time, by employing means for controlling the rotation rate of the crucible or means for controlling rotation rate of the seed, each of which comprises a D.C. voltage, a function generator, a voltage summing circuit and a stepping motor.

A preferred embodiment of the present invention is explained in detail with references of the accompanying drawings, which should not be taken to limit the scope of the present invention.

Figure 1:
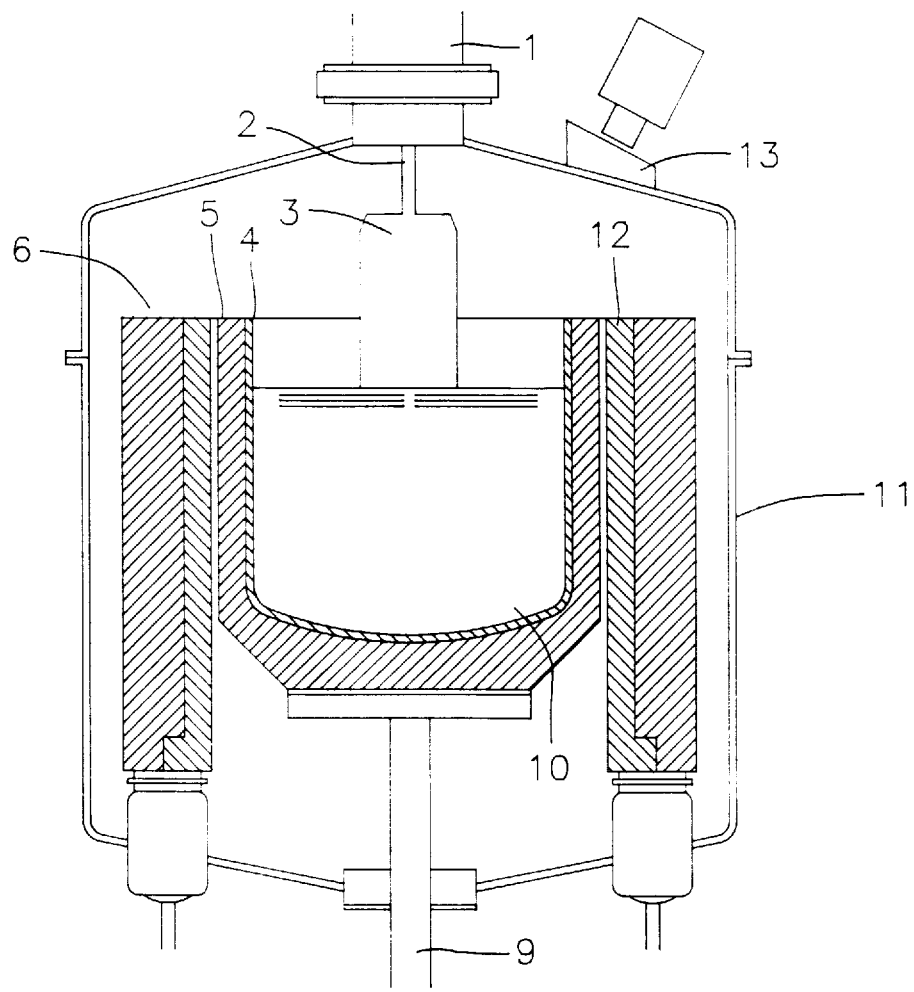
FIG. 1 is a schematic diagram showing a conventional apparatus for SCS preparation employing Czochralski method.
Figure 2:
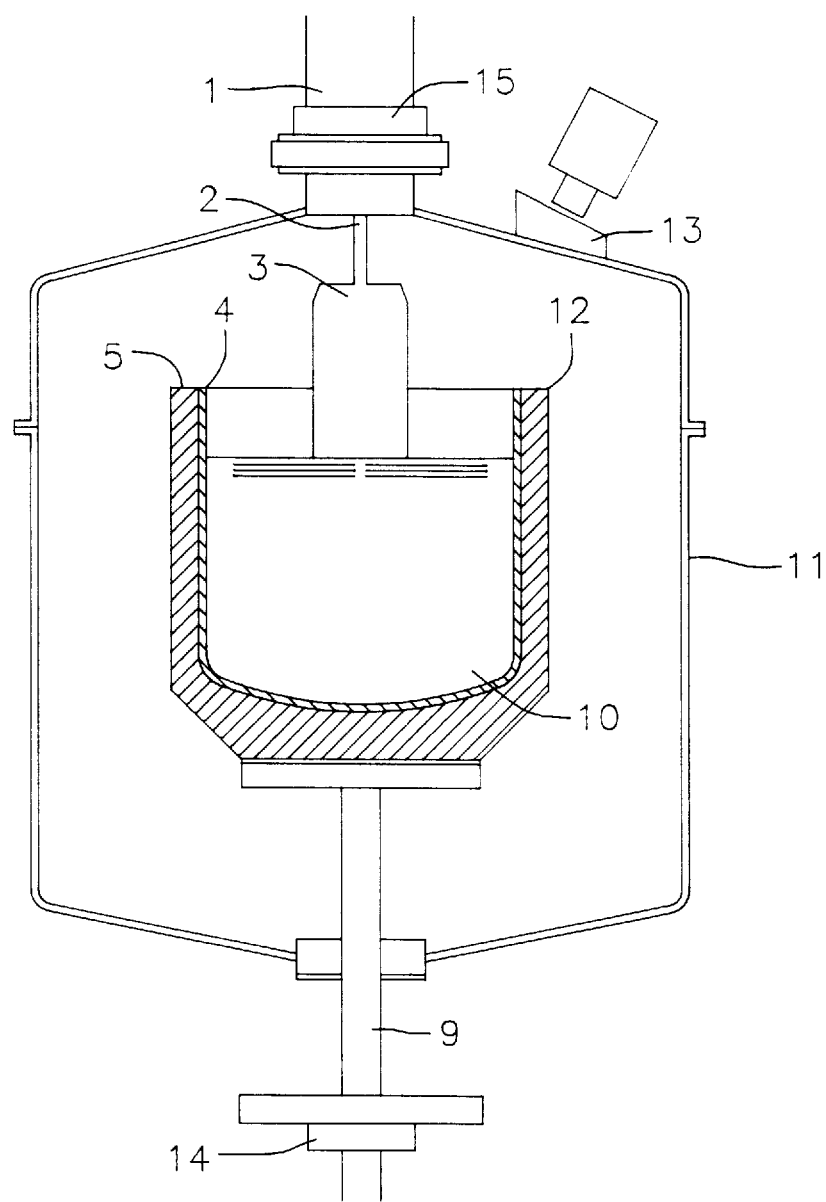
FIG. 2 is a cross-sectional diagram showing an apparatus for SCS preparation of the present invention.

FIG. 2 is a cross-sectional diagram showing an apparatus for SCS preparation of the present invention. Referring to FIG. 2, the apparatus for preparing a SCS comprises a rotating axis of seed(1), a seed(2), a crucible(4), a heater(5), a rotating axis of crucible(9), a chamber(11) and an adiabatic layer(12), which is characterized by comprising means for controlling the rotation rate of the crucible or seed, in the conventional apparatus for preparing a SCS employing Czochralski method.

Figure 3:
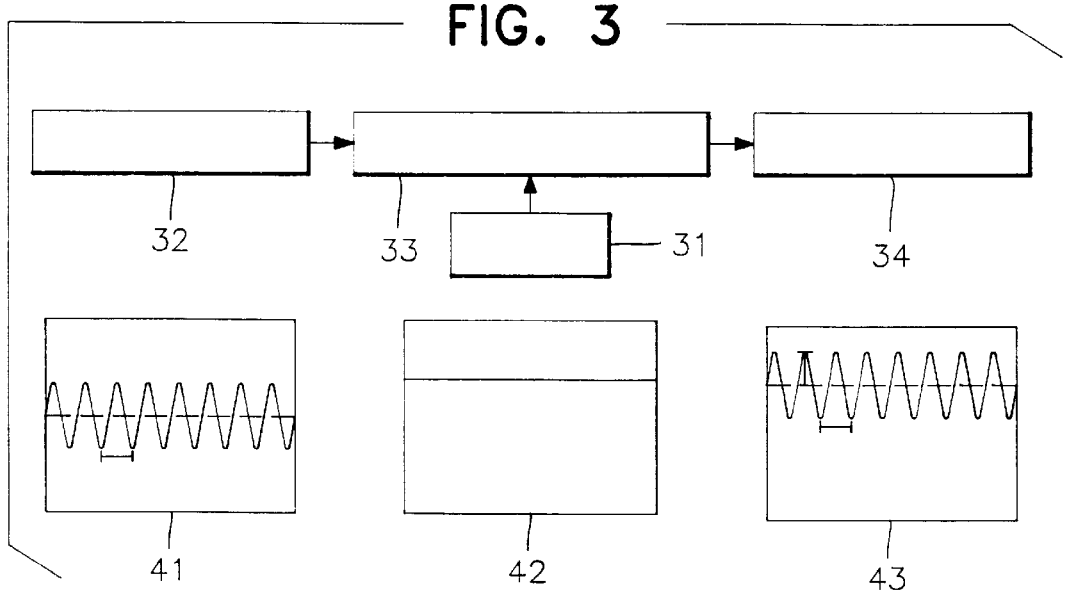
FIG. 3 is a block diagram depicting means for controlling the rotation rate in the apparatus and waveforms of voltage generated from each block.

As illustrated in FIG. 3, the means(14) for controlling the rotation rate of the crucible or means(15) for controlling the rotation rate of the seed is constructed to comprise a D.C. voltage(31), a function generator(32), a voltage summing circuit(33) and a stepping motor(34).

On the other hand, the apparatus may further comprise an electrode(6) for the formation of magnetic field in the crucible(4), to lower the striation of SCS caused by the temperature oscillation of molten silicon in the preparation of SCS, in addition to the means(14) (15) for controlling the rotation rate of the crucible(4) or the seed(2) each of which changes the rotation rate of the crucible or seed. At this moment, the means(14) for controlling the rotation rate of the crucible(4) and means(15) for controlling the rotation rate of the seed(2) are constructed to change the rotation rate to be dependent on time, in accordance with the general formula $\Omega = \Omega_0(1 + A\sin 2\pi ft)$ (wherein, $\Omega$ represents the rotation rate of a crucible or a seed by a stepping motor, $\Omega_0$ represents the rotation rate of a crucible or a seed of a conventional apparatus for SCS preparation, A represents an amplification factor of rotation rate, f represents a frequency factor of rotation rate and t represents time).

The operation mode of the apparatus for preparing a SCS of the invention is described in more detail with references on the accompanying drawings.

In the means(14) for controlling the rotation rate of the crucible(4) or means(15) for controlling the rotation rate of the seed(2) depicted in FIG. 3, direct current generated by a D.C. voltage(31) and sine-wave generated by a function generator(32) are added to a voltage summing circuit(33) to give a characteristic waveform: The D.C. voltage(31) generates direct current which can rotate the crucible or the seed in a conventional apparatus for a SCS preparation; and, the function generator(32) generates a sine-wave with modulated frequency and amplitude, which is added to a voltage summing circuit(33). The voltage summing circuit(33) generates time-dependent voltage which is a sum of voltage generated from the D.C. voltage(31) and the function generator(32); and the voltage which is added to the voltage summing circuit(33) is applied to a stepping motor(34) which is, in turn, rotated with a changed rotation rate.

As a consequence, the stepping motor produces a modified rotation rate $(\Omega = \Omega_0 + \Omega_f)(43)$ which is a sum of a rotation rate $(\Omega_0)(41)$ attributed by voltage from the D.C. voltage(31) and a number of rotation$(\Omega_f)(42)$ attributed by voltage from the function generator(32). That is to say, the voltage from the D.C. voltage(31) and the sine-wave from the function generator(32) are added to the voltage summing circuit(33), and the stepping motor(34) is rotated by the voltage applied by the voltage summing circuit(33) with a time-dependent number of rotation. Accordingly, the axes of rotation(1), (9) linked to the stepping motor(34) are rotated with a time-dependent change, and the rotation rates of the crucible(4) and the seed(2) are varied. At this time, the time-dependent rotation rate of the crucible(4) and the seed(2) has a sine-wave, where average of rotation number, amplification of rotation number and frequency are controlled by controlling the voltage generated from the D.C. voltage(31) and the function generator(32). Accordingly, the rotation rate of the crucible(4) and the seed(2) can be controlled by the means(14)(15) for controlling the rotation rate of the crucible and the seed.

Since the temperature oscillation is lowered in an efficient manner under a specific amplification and frequency factor of rotation rate, the temperature oscillation in the crucible(4)

can be lowered by controlling the rotation rate. Accordingly, the apparatus of the invention can drastically lower the striation caused by temperature oscillation which is appeared at the interface of molten silicon and solid-phase SCS in the course of SCS growth, by controlling the rotation rate of the crucible(4) or the seed(2).

Numerical analysis results for flow and temperature fields in the crucible(4) of the apparatus, according to the present invention, are illustrated as follows:

Voltage generated from the voltage summing circuit(34) which is a sum of direct current and sine-wave current is applied to the stepping motor(34), to make a sine-wave modulation in the rotation rate($\Omega_0$) of the crucible(4) or the seed(2) of a conventional apparatus, then the rotation rate of $\Omega = \Omega_0(1+A\sin2\pi ft)$ is obtained.

In the course of preparing a SCS by employing the apparatus of the present invention, time history of temperature oscillation at the crystal/melt interface in the crucible(4) was determined, and numerical analysis results of the temperature oscillation under a flow condition was obtained.

Figure 4:
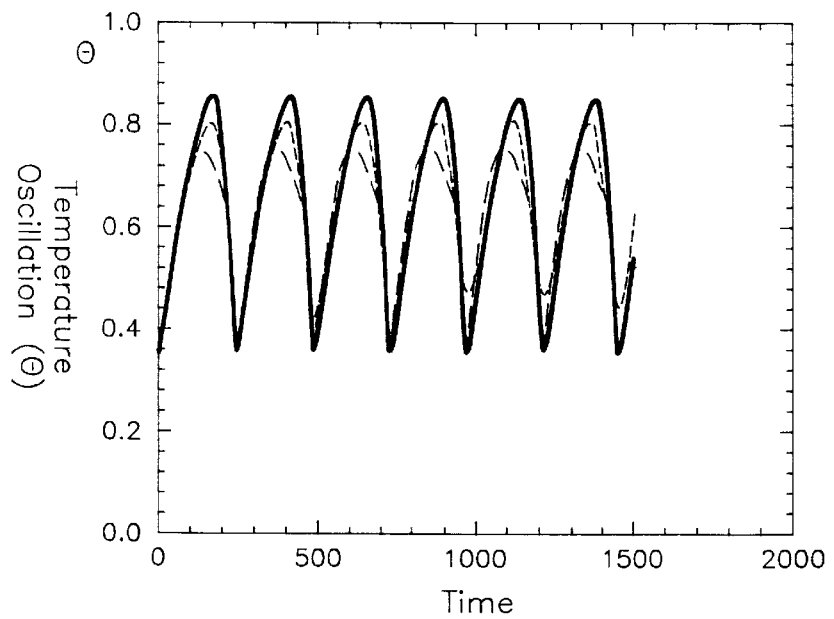
FIG. 4 is a graph showing a time history of temperature oscillation.

FIG. 4 shows a time history of temperature oscillation, under a variety of amplification of rotation rate after fixing the frequency factor of rotation rate as 1.0. The frequency factor represents the ratio of natural frequency in the oscillatory melt flow when the rotation rate of crucible or seed is keeping with constant, and exciting frequency which is superimposed rotation rate of crucible or seed with single sine-wave form. In FIG. 4, (—) represents a case in which the amplification factor of rotation rate is 0 (i.e., time history of temperature oscillation under a constant rotation rate of the conventional apparatus); (···) and (-··-) represent time history of temperature oscillation when the amplification factor of rotation rate(A) is 0.15 and 0.30, respectively. As can be seen in FIG. 4, it is clearly determined that: the amplification factor of temperature oscillation is lowered when the rotation rate of seed(2) is changed, as compared with the case of a constant rotation rate, while the frequency mode of temperature oscillation is not changed.

Figure 5:
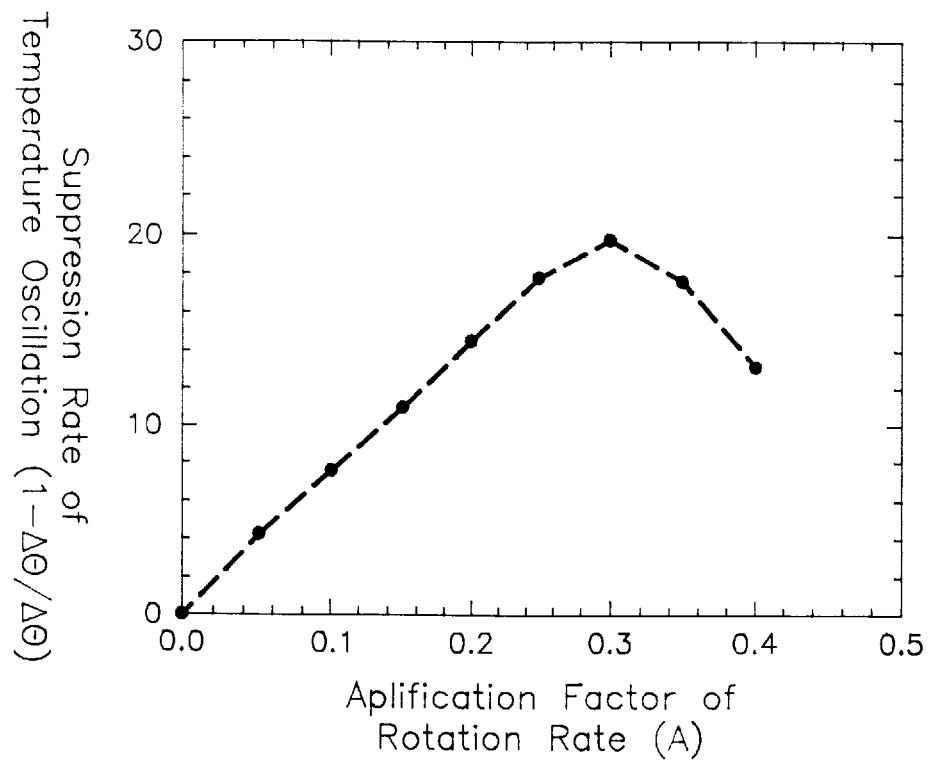
FIG. 5 is a graph showing suppression rate of temperature oscillation in accordance with amplification factor of rotation rate.

FIG. 5 shows a suppression rate of temperature oscillation against the amplification factor of rotation rate. As can be seen in FIG. 5, the suppression rate of temperature oscillation become elevated in a proportional to the amplification factor of rotation rate and lowered when the amplification of rotation rate(A) is over 0.3. Accordingly, it is clearly determined that the temperature oscillation in the apparatus of the invention can be efficiently controlled, when the amplification factor of rotation rate(A) is 0.3.

Figure 6:
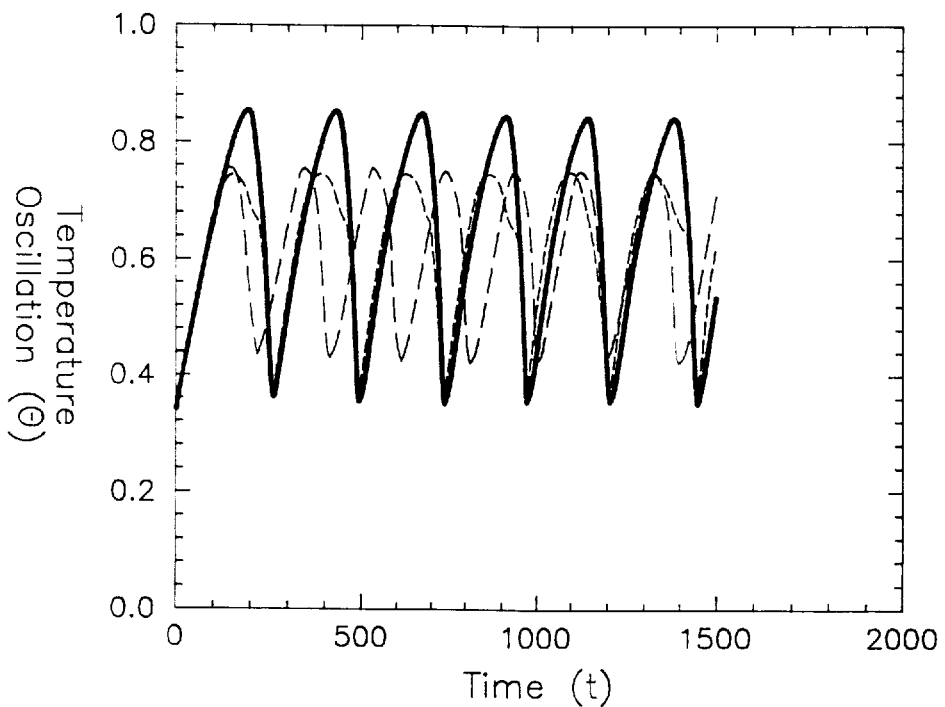
FIG. 6 is a graph showing a time history of temperature oscillation.

FIG. 6 shows a time history of temperature oscillation against the frequency factor of rotation rate, under a variety of frequency of rotation after fixing the amplification of rotation(A) as 0.3. In FIG. 6, (—) represents a case in which the amplification factor of rotation rate is 0 (i.e., time history of temperature oscillation under a constant rotation rate of the conventional apparatus); (···) and (-··-) represent time history of temperature oscillation when the frequency factor of rotation rate is 1.0 and 1.2, respectively. As can be seen in FIG. 6, it is determined that: the frequency of temperature oscillation is varied, as the frequency factor of rotation rate is changed, and the amplification of temperature oscillation become lowered.

Figure 7:
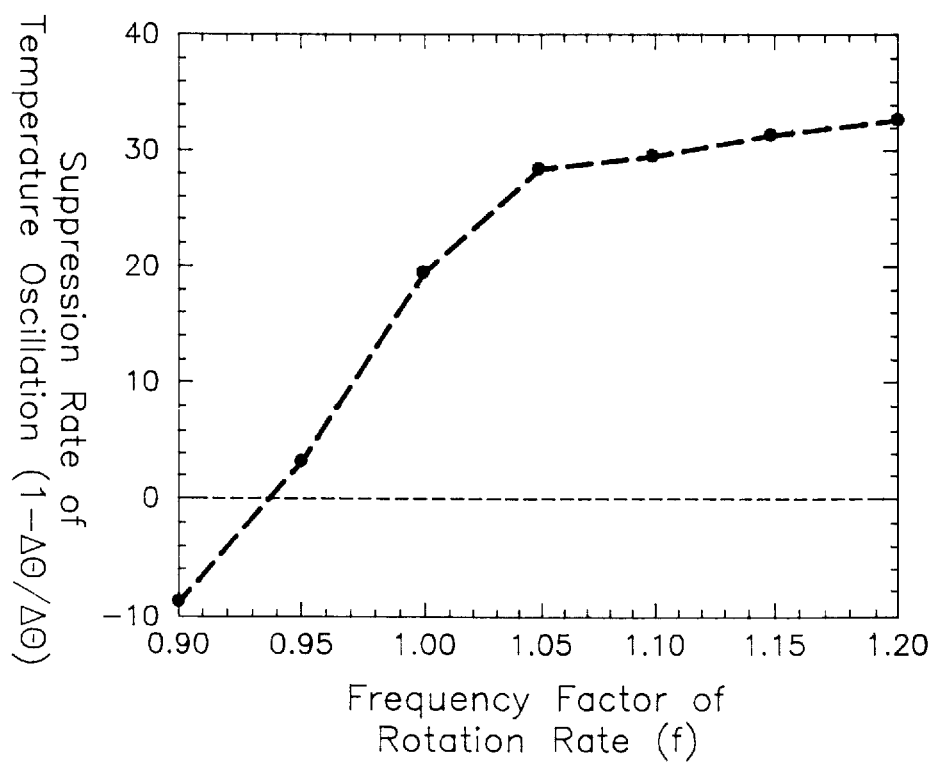
FIG. 7 is a graph showing suppression rate of temperature oscillation in accordance with frequency factor of rotation rate.

FIG. 7 shows the suppression rate temperature oscillation against frequency factor of rotation rate. As can be seen in FIG. 7, it is determined that: the amplification of temperature oscillation is efficiently lowered with the suppression rate of temperature oscillation of over 30%, when the frequency($f_g$) of rotation rate is 1.2.

To prepare a high-quality of SCS by the apparatus of the present invention, molten silicon(10) contained in a crucible (4) is first heated by a heater(5) positioned at the outer side of the crucible(4), and a seed(2) is pulled out by rotating the crucible(4) or seed(2), while changing the rotation rate of the crucible(4) or seed(2) in accordance with the formula $\Omega = \Omega_0 (1+A\sin2\pi ft)$ by means(14) for controlling the rotation rate of the crucible or means(15) for controlling the rotation rate of the seed, each of which comprises a D.C. voltage(31), a function generator(32), a voltage summing circuit(33) and a stepping motor(34).

The apparatus of the present invention may further comprise an electrode for the formation of magnetic field in the crucible, to lower the striation of SCS efficiently. In this case, magnetic field necessary to the preparation of SCS become less than that of prior art apparatus, which enables the apparatus of the invention to prepare SCS in an economical manner. Moreover, the apparatus of the invention may further comprise a septum in the crucible, to lower striation of SCS in a more efficient manner.

In describing the present invention, the apparatus for preparing a SCS is illustrated under an assumption that conventional Czochralski method is employed to prepare SCS. However, the apparatus of the invention can be applied in the methods by which a SCS can be grown by rotating a crucible or a seed or by which single crystal of other materials except for silicon can be prepared.

As clearly illustrated as aboves, the present invention provides an apparatus for preparing a single crystal of silicon which can remove striation in molten silicon, without any complicated auxiliary equipments or extra energy consumption, and can be applied to manufacture a large-sized wafer, and provides a process for preparing a high-quality single crystal of silicon by the apparatus in a simple and economical manner.

What is claimed is:

1. In an apparatus for preparing a single crystal of silicon which comprises a rotating axis of seed, a seed, a crucible, a heater, a rotating axis of crucible, a chamber and an adiabatic layer, the improvement comprising means for controlling the rotation rate of the crucible which consists of a D.C. voltage, a function generator, a voltage summing circuit and a stepping motor, the means for controlling the rotation rate of the crucible constructed to change the rotation rate of the crucible to be dependent on time, in accordance with a general formula (I) represented as:

$$\Omega = \Omega_0(1+A\sin2\pi ft) \tag{I}$$

where $\Omega$ represents the rotation rate of a crucible by a stepping motor; $\Omega_0$ represents the rotation rate of a crucible of a conventional apparatus for a single crystal of silicon preparation; A represents and amplification factor of rotation rate; f represents a frequency factor of rotation rate with respect to natural frequency; and, t represents nondimensional time.

2. The apparatus for preparing a single crystal of silicon of claim 1, further comprising an electrode for the formation of magnetic field in the crucible.

3. In an apparatus for preparing a single crystal of silicon which comprises a rotating axis of seed, a seed, a crucible, a heater, a rotating axis of crucible, a chamber and an adiabatic layer, the improvement comprising means for controlling the rotation rate of the seed which consists of a D.C. voltage, a function generator, a voltage summing circuit and a stepping motor, the means for controlling the rotation rate of the seed constructed to change the rotation rate of the seed to be dependent on time, in accordance with a general formula (I) represents as:

$$\Omega = \Omega_0 (1 + A\sin 2\pi ft) \quad \text{(I)}$$

where $\Omega$ represents the rotation rate of a seed by a stepping motor; $\Omega_0$ represents the rotation rate of a seed of a conventional apparatus for a single crystal of silicon preparation; A represents and amplification factor of rotation rate; f represents a frequency factor of rotation rate with respect to natural frequency; and, t represents nondimensional time.

4. The apparatus for preparing a single crystal of silicon of claim 3, further comprising an electrode for the formulation of magnetic field in the crucible.

* * * * *